US011218157B2

(12) United States Patent
Choi

(10) Patent No.: US 11,218,157 B2
(45) Date of Patent: Jan. 4, 2022

(54) TOUCH DRIVING DEVICE AND DISPLAY DEVICE FOR DIRECTLY SENSING DISPLAY ELECTRODE NOISE

(71) Applicant: SILICON WORKS CO., LTD., Daejeon (KR)

(72) Inventor: Jung Min Choi, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/524,944

(22) Filed: Jul. 29, 2019

(65) Prior Publication Data

US 2020/0036386 A1    Jan. 30, 2020

(30) Foreign Application Priority Data

Jul. 30, 2018 (KR) .................. 10-2018-0088352

(51) Int. Cl.
*H03M 1/08* (2006.01)
*H01L 27/32* (2006.01)
*G06F 3/044* (2006.01)
*G06F 3/041* (2006.01)

(52) U.S. Cl.
CPC ............ *H03M 1/08* (2013.01); *G06F 3/0412* (2013.01); *G06F 3/0441* (2019.05); *G06F 3/0442* (2019.05); *H01L 27/323* (2013.01)

(58) Field of Classification Search
CPC ............. G06F 3/04162; G06F 3/04182; G06F 3/0442; G06F 3/0441; G06F 3/0412; G06F 3/044; H01L 27/323; H01L 51/5281; H01L 51/5271; H01L 27/3218; H03M 1/08
See application file for complete search history.

(56) References Cited

U.S. PATENT DOCUMENTS

| | | | |
|---|---|---|---|
| 10,241,597 B2 | 3/2019 | Jung et al. | |
| 2011/0057890 A1* | 3/2011 | Goo | G06F 3/041 345/173 |
| 2017/0285771 A1* | 10/2017 | Jung | G06F 3/0442 |
| 2021/0004120 A1* | 1/2021 | Kim | G06F 3/0446 |

FOREIGN PATENT DOCUMENTS

| | | |
|---|---|---|
| JP | 5354545 B2 | 11/2013 |
| JP | 5885237 B2 | 3/2019 |
| KR | 10-2016-0143067 A | 12/2016 |
| KR | 10-2017-0090968 A | 8/2017 |

\* cited by examiner

*Primary Examiner* — Yaron Cohen
(74) *Attorney, Agent, or Firm* — Fenwick & West LLP

(57) ABSTRACT

A technique is disclosed for sensing a display electrode in addition to a touch sensor in order to remove noise delivered from the display electrode to the touch sensor through parasitic capacitance, and generating a touch signal by removing a noise signal, generated from the display electrode, from a sensor signal generated by the touch sensor.

10 Claims, 10 Drawing Sheets

TOUCH DRIVING DEVICE AND DISPLAY DEVICE FOR DIRECTLY SENSING DISPLAY ELECTRODE NOISE

CROSS REFERENCE TO RELATED APPLICATIONS

This application claims priority from Republic of Korea Patent Application No. 10-2018-0088352, filed on Jul. 30, 2018, which is hereby incorporated by reference in its entirety.

BACKGROUND

Field of Technology

The present embodiment relates to a technique for driving a touch sensor, and a display device.

Description of the Prior Art

As panels become thinner, more parasitic capacitance exists between a touch sensor and a display electrode, such as a data line, a gate line, a common electrode, a cathode electrode, etc.

Parasitic capacitance can act as a path along which noise travels into touch sensors. For example, a display driving voltage supplied to a display electrode can be recognized as noise by a touch sensor, and parasitic capacitance can provide a path along which noise caused by the display driving voltage travels into the touch sensor.

The more parasitic capacitance or the faster the pattern of display driving voltage changes, the more noise can flow into touch sensors. These days, as panels have become thinner, parasitic capacitance has become higher as mentioned above, and the pattern of display driving voltage also tends to change more rapidly as the refresh rate of displays grows higher due to higher resolutions thereof. For that reason, the problem of noise traveling into touch sensors is growing.

SUMMARY

Accordingly, an aspect of the present embodiment is to provide a technique for increasing signal sensitivity of a touch sensor by removing or minimizing influence of noise traveling into the touch sensor.

In view of the foregoing, an embodiment provides a touch driving device including: a receiving unit configured to generate a touch signal by removing—for example, by substracting—a noise signal, obtained by processing a signal received from a display electrode, from a sensor signal obtained by processing a signal received from a touch sensor; and a control unit configured to generate touch data by processing the touch signal.

In the touch driving device, when the sensor signal is received, a display driving voltage may be supplied to the display electrode.

The touch driving device may further include a driving unit configured to transmit an uplink signal to an active pen, which is a kind of a touch pen, through the touch sensor, wherein the receiving unit receives a downlink signal delivered from the active pen to the touch sensor and generates the touch signal.

The touch driving device may further include a driving unit configured to supply a touch driving signal to the touch sensor, wherein the receiving unit receives a response signal formed in the touch sensor in response to the touch driving signal and generates the touch signal.

In the touch driving device, the receiving unit may process a signal, received from the display electrode, by using at least one of a filter and an amplifier.

In the touch driving device, the receiving unit may generate the touch signal by integrating a signal obtained by removing the noise signal and a reference voltage signal from the sensor signal.

In the touch driving device, the touch sensor and the display electrode are disposed on a same layer and selectively connected to one input terminal or another input terminal of the receiving unit through a switch element.

In the touch driving device, the touch sensor and the display electrode are cathode electrodes of an Organic Light Emitting Diode (OLED) panel or common electrodes to which a common voltage is supplied in a Liquid Crystal Display (LCD) panel.

In the display device, the receiving unit receives a reference electrode signal corresponding to a voltage formed in the display electrode and processes the reference electrode signal to generate the noise signal.

In the display device, the receiving unit comprises an integrator, comprising one terminal to which the sensor signal is delivered and another terminal to which the noise signal is delivered, and wherein the receiving unit integrates a signal, obtained by removing the noise signal from the sensor signal, into a capacitor connected to the one terminal and an output terminal of the integrator to output the integrated signal.

Another embodiment provides a display device including: a touch sensor layer in which multiple touch sensors are disposed; a display electrode layer in which at least one display electrode is disposed to have parasitic capacitance formed between the touch sensors and the at least one display electrode; a display driving device configured to supply a display driving voltage to the display electrode; and a touch driving device which generates a touch signal by removing a noise signal, obtained by processing a signal received from the display electrode, from a sensor signal, obtained by processing a signal received from the touch sensors.

In the display device, the display electrode may be a common electrode, and a liquid crystal layer or a color filter layer may be interposed between the display electrode and the touch sensors.

In the display device, the display electrode may be a cathode electrode of an Organic Light Emitting Diode (OLED), and an insulation film may be interposed between the display electrode and the touch sensors.

In the display device, the multiple touch sensors may be disposed to be electrically separated from one another, the at least one display electrode may be disposed to be electrically connected, and the touch driving device may be connected to the multiple touch sensors through multiple touch signal lines and may be connected to the at least one display electrode through one electrode signal line.

Another embodiment provides a display device including: an electrode layer in which multiple electrodes, each functioning as a display electrode and a touch sensor are disposed; a display driving device configured to supply display a driving voltage to the electrodes; and a touch driving device configured to generate a touch signal by removing a noise signal from a sensor signal obtained by processing a signal received from one electrode functioning as the touch sensor, the noise signal being obtained by process of a signal received from at least one of the other electrodes functioning as the display electrode.

In the display device, the electrodes may be selectively connected through a switch element to a first input terminal or a second input terminal of a channel included in the touch driving device, and the touch driving device may generate the sensor signal by processing a signal received at the first input terminal of the channel and may generate the noise signal by processing a signal received at the second input terminal of the channel. The one electrode may be connected to the first input terminal, and the other multiple electrodes may be connected to the second input terminal.

In the display device, the switch element may be disposed in a non-display area of a panel or in the touch driving device.

The display device may further include a data driving device configured to supply a data voltage, into which image data is converted, to pixels through data lines, wherein the one electrode and the at least one of the other electrodes are coupled by the same data line and parasitic capacitance.

In the display device, the one electrode and the at least one of the other electrodes are disposed in parallel to the data line.

As hereinbefore described, the present embodiment can increase the signal sensitivity of a touch sensor by removing or minimizing influence of noise traveling into the touch sensor.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
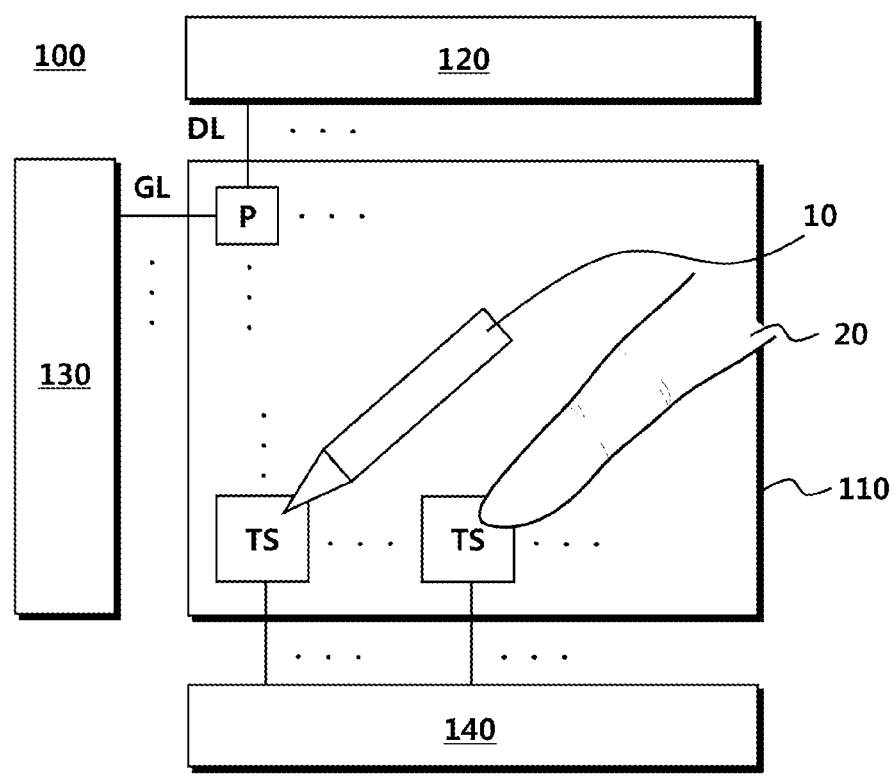
FIG. 1 is a schematic diagram of a display device according to an embodiment.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a schematic diagram of a display device according to an embodiment.

Referring to FIG. 1, a display device 100 may include a panel 110, a data driving device 120, a gate driving device 130, a touch driving device 140, etc.

Each of the data driving device 120, gate driving device 130, and touch driving device 140 may drive at least one component included in the panel 110.

The data driving device 120 may drive a data line DL connected to a pixel P, and the gate driving device 130 may drive a gate line GL connected to a pixel P. The touch driving device 140 may drive a touch sensor TS disposed on the panel 110.

The data driving device 120 may supply a data voltage to each pixel P of the panel 110 through the data line DL to display an image. The data driving device 120 may include at least one data driver integrated circuit. The at least one data driver integrated circuit may be connected to a bonding pad of the panel 110 by the use of a Tape Automated Bonding (TAB) technique or a Chip On Glass (COG) technique, may be directly formed on the panel 110, or may be formed to be integrated on the panel 110, according to circumstances. In addition, the data driving device 120 may be implemented using a Chip On Film (COF) technique.

The gate driving device 130 may supply a scan signal to the gate line GL to turn on/off a transistor located at each pixel P. The gate driving device 130 may be located only on one side of the panel 110 as illustrated in FIG. 1, or divided into two and located on both sides of the panel 110, according to driving modes. In addition, the gate driving device 130 may include at least one gate driver integrated circuit. The at least one gate driver integrated circuit may be connected to a bonding pad of the panel 110 by the use of a Tape Automated Bonding (TAB) technique or a Chip On Glass (COG) technique, may be implemented as a Gate In Panel (GIP) and directly formed on the panel 110, or may be formed to be integrated on the panel 110, according to circumstances. In addition, the gate driving device 130 may be implemented using a Chip On Film (COF) technique.

An electrode to which a voltage for driving a display panel is supplied can be called a display electrode. The display electrode may be, for example, a data line DL, a gate line GL, a driving voltage line, a common electrode to which a common voltage is supplied in a liquid crystal display (LCD), an anode/cathode electrode of an organic light emitting diode (OLED) in an OLED panel, or the like. A device for driving the display electrode can be called a display driving device.

A display driving voltage may be supplied to the display electrode. For example, a data voltage may be supplied to the data line DL. A scan signal may be supplied to the gate line GL. A pixel driving voltage VDD may be supplied to the driving voltage line, a common voltage may be supplied to the common electrode, the pixel driving voltage VDD may be supplied to the anode electrode of the OLED, and a base voltage VSS may be supplied to the cathode electrode of the OLED. The data voltage may be supplied by the data driving device 120, and the scan signal may be supplied by the gate driving device 130. The common voltage may be supplied by a common voltage supply device. The pixel driving voltage VDD may be supplied by a driving voltage supply device, and the base voltage VSS may be supplied by a base voltage supply device. The common voltage supply device, the driving voltage supply device, and the base voltage supply device may be implemented into a single device or implemented into different devices.

The display panel may be included in the panel 110, and a touch panel (Touch screen Panel (TSP)) may be further included in the panel. The display panel and the touch panel may share a certain constituent element. For example, when the display panel is a LCD panel, a touch sensor TS for sensing a touch in the touch panel may be used as a common electrode to which a common voltage is supplied in the display panel. For another example, when the display panel is an OLED panel, the touch sensor TS may be used as a cathode electrode to which a base voltage VSS is supplied in the display panel. Although panel 110 is also called an integrated panel for the reason that the display panel and the touch panel share a certain constituent element, the disclosure is not limited thereto. In addition, as an integrated type in which a display panel and a touch panel are combined, an In-Cell type panel is widely known. However, the In-Cell type panel is a mere example of the panel 110 described above, and the panel according to the disclosure is not limited to such an In-Cell type panel.

A plurality of touch sensors TS is disposed on the panel 110, and the touch driving device 140 may drive the touch sensors TS by using a touch driving signal. The touch driving device 140 may generate a sensing value for a touch sensor TS according to a response signal formed by the touch sensor TS in response to the touch driving signal. The touch driving device 140 may calculate touch coordinates of an object 20 by using sensing values for the plurality of touch sensors TS disposed on the panel 110, and the calculated touch coordinates may be used after being transmitted to another device, for example a host.

The touch driving device 140 may send or receive a signal to or from an active pen 10 by means of the touch sensors TS. The touch driving device 140 may supply an uplink signal to a touch sensor TS, and the active pen 10 may receive the uplink signal by being brought into contact with the touch sensor TS. The uplink signal may include, for example, information such as panel information or a protocol version, a synchronization signal, or the like. The active pen 10 may obtain panel information or a protocol version by receiving the uplink signal and may perform signal synchronization.

The active pen 10 may transmit a downlink signal to a touch sensor TS. The touch driving device 140 may receive the downlink signal through the touch sensor TS. The downlink signal may include state information of the active pen. The state information of the active pen may include, for example, the position of the active pen, a button state of the active pen, a battery state of the active pen, the tilt of the active pen, etc.

Parasitic capacitance may be formed between a display electrode and a touch sensor TS. Such parasitic capacitance may provide a path along which noise travels inside, and may be a factor causing low signal sensitivity when the touch driving device 140 receives a response signal in response to a touch driving signal or receives a downlink signal from the active pen 10.

Figure 2:
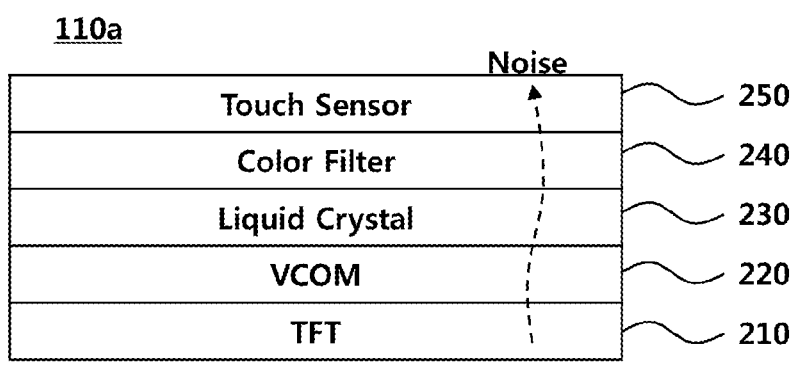
FIG. 2 is an exemplary schematic diagram illustrating a panel configured as an LCD panel according to an embodiment.

FIG. 2 is an exemplary schematic diagram illustrating a panel configured as a LCD panel, according to an embodiment.

Referring to FIG. 2, a panel 110a may include a thin film transistor (TFT) substrate 210, a common electrode layer (VCOM) 220, a liquid crystal layer 230, a color filter layer 240, a touch sensor layer 250, etc.

A pixel electrode and a transistor disposed in a pixel may be disposed on the TFT substrate 210, and a common electrode may be disposed on the common electrode layer 220. The TFT substrate 210 and the common electrode layer 220 can be collectively called a display electrode layer.

Display electrodes, e.g., a gate line, a data line, a common electrode, etc., may be disposed on the display electrode layer, and a display driving voltage supplied to the display electrodes may be recognized as noise at the touch sensor layer 250. The liquid crystal layer 230 and/or color filter layer 240 may be interposed between the display electrode layer and the touch sensor layer 250, and parasitic capacitance may be formed between the display electrode and the touch sensor due to the liquid crystal layer 230 and/or the color filter layer 240.

Due to such parasitic capacitance, noise formed in the display electrode layer, i.e. display electrode noise, may travel into the touch sensor.

Figure 3:
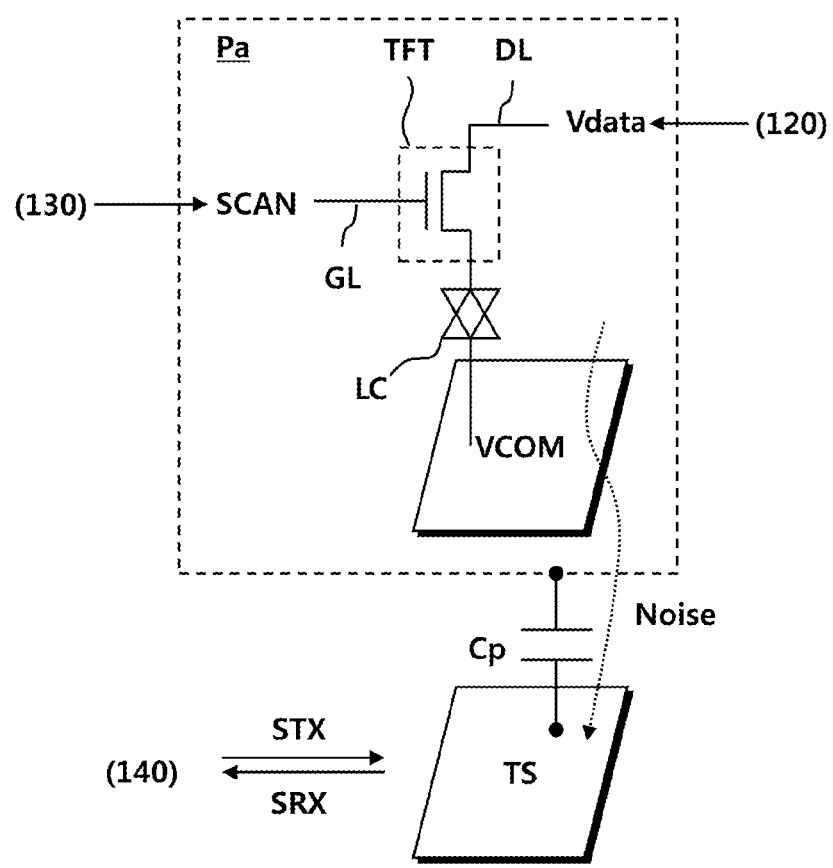
FIG. 3 is a diagram illustrating formation of parasitic capacitance in an LCD panel according to an embodiment.

FIG. 3 is a diagram illustrating formation of parasitic capacitance in an LCD panel according to an embodiment.

Referring to FIG. 3, a pixel Pa of the LCD panel may include a transistor TFT, a liquid crystal LC, and a common electrode VCOM.

The gate terminal of the transistor TFT may be connected to a gate line GL, the drain terminal thereof may be connected a data line DL, and the source terminal thereof may be connected to the liquid crystal LC.

When a scan signal SCAN corresponding to a turn-on voltage is supplied to the gate terminal through the gate line GL, the drain terminal and source terminal of the transistor TFT may be connected to allow a data voltage Vdata to be supplied to the liquid crystal LC. The scan signal SCAN may be supplied by the gate driving device 130, and the data voltage Vdata may be supplied by the data driving device 120.

Common voltage may be supplied to the common electrode VCOM. The brightness of the pixel Pa may be adjusted by control of the liquid crystal LC according to the difference between the common voltage and the data voltage Vdata.

A touch sensor TS may be connected to the touch driving device 140. The touch driving device 140 may transmit a TX signal STX to the touch sensor TS and receive a RX signal SRX from the touch sensor TS. The TX signal STX may include a touch driving signal and an uplink signal transmitted to an active pen, and the RX signal SRX may include a response signal in response to the touch driving signal and a downlink signal received from the active pen.

Parasitic capacitance Cp may be formed between the touch sensor TS and display electrodes, for example the data line DL, gate line GL, common electrode VCOM, etc. The amount of parasitic capacitance Cp may vary according to the spacing distance from the touch sensor TS to each of the display electrodes, and the size of each of the display electrodes. In a normal LCD panel, the parasitic capacitance between the touch sensor TS and the common electrode VCOM may be the highest.

In an in-cell type panel, the touch sensor TS and the common electrode VCOM may be the same. In this case, the parasitic capacitance Cp between a common electrode VCOM operated as the touch sensor TS and a nearby common electrode VCOM may be formed the highest.

Display electrode noise formed at display electrodes, for example the data line DL, gate line GL, common electrode VCOM, etc., may travel into the touch sensor TS through such parasitic capacitance Cp.

Figure 4:
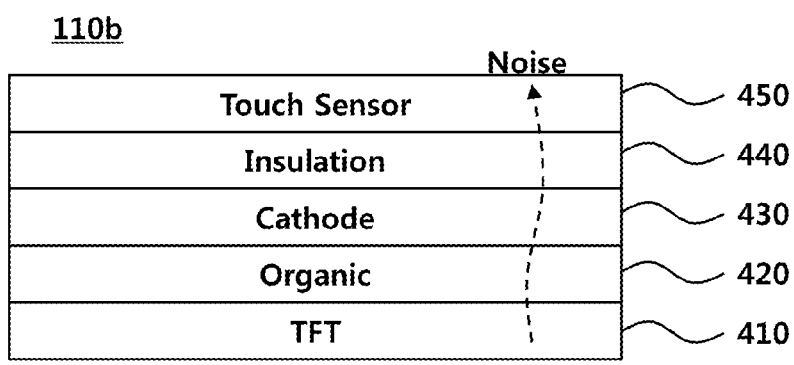
FIG. 4 is an exemplary schematic diagram illustrating a panel configured as an OLED panel according to an embodiment.

FIG. 4 is an exemplary schematic diagram illustrating a panel configured as an OLED panel, according to an embodiment.

Referring to FIG. 4, a panel 110b may include a TFT substrate 410, an organic light-emitting material layer 420, a cathode electrode layer 430, an insulation layer 440, a touch sensor layer 450, etc.

An anode electrode and a transistor disposed in a pixel may be disposed on the TFT substrate 410, and an organic light-emitting material, configured to emit light by using electric energy, may be disposed in the organic light-emitting material layer 420. A cathode electrode, configured to supply a base voltage to an OLED, may be disposed on the cathode electrode layer 430. The TFT substrate 410, the organic light-emitting material layer 420, and the cathode electrode layer 430 can be collectively called a display electrode layer.

Display electrodes, e.g., the gate line, data line, anode electrode, cathode electrode, etc., may be disposed in the display electrode layer, and a display driving voltage supplied to the display electrodes may be recognized as noise at the touch sensor layer 450. The insulation layer 440 and the like may be interposed between the display electrode layer and the touch sensor layer 450, and parasitic capacitance may be formed between the display electrode and the touch sensor due to the insulation layer 440.

Figure 5:
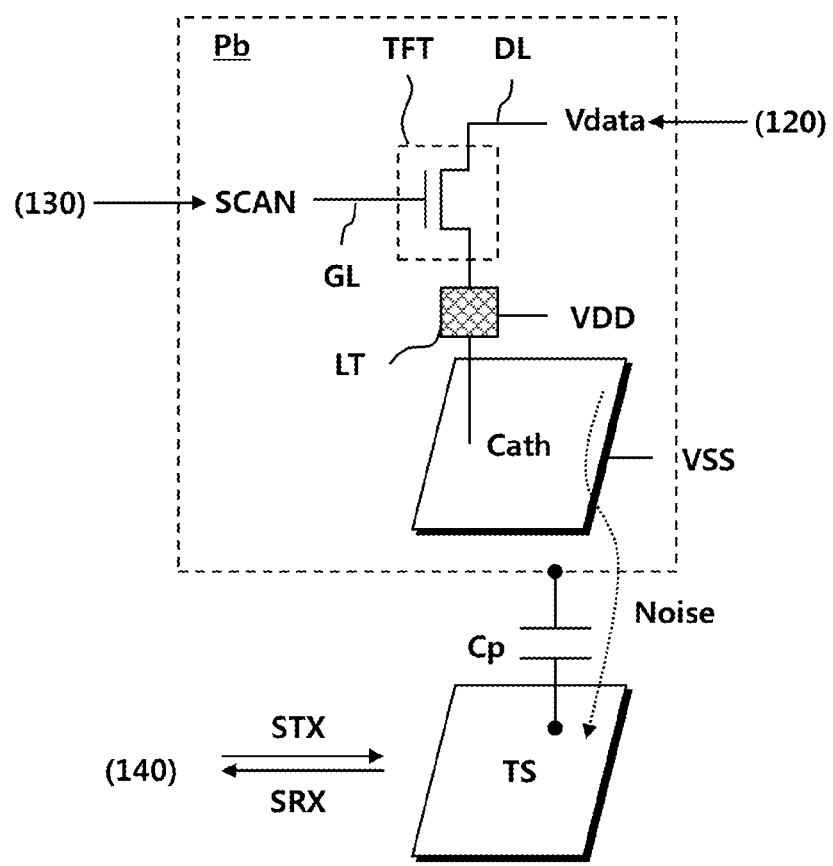
FIG. 5 is a diagram illustrating formation of parasitic capacitance in an OLED panel according to an embodiment.

FIG. 5 is a diagram illustrating formation of parasitic capacitance in an OLED panel according to an embodiment.

Referring to FIG. 5, a pixel Pb of the OLED panel may include a transistor TFT, an OLED structure LT, and a cathode electrode Cath.

The gate terminal of the transistor TFT may be connected to a gate line GL, the drain terminal thereof may be connected a data line DL, and the source terminal thereof may be connected to the OLED structure LT.

When a scan signal SCAN corresponding to a turn-on voltage is supplied to the gate terminal through the gate line GL, the drain terminal and source terminal of the transistor TFT may be connected to allow a data voltage Vdata to be supplied to the OLED structure LT. The scan signal SCAN may be supplied by the gate driving device 130, and the data voltage Vdata may be supplied by the data driving device 120.

The OLED structure LT may include a driver transistor (not illustrated) and an OLED (not illustrated). A pixel driving voltage VDD is supplied to the driver transistor (not illustrated). The pixel driving voltage VDD may be delivered to an anode electrode of the OLED (not illustrated) according to the data voltage Vdata supplied to the driver transistor (not illustrated).

A base voltage VSS may be supplied to the cathode electrode Cath. The brightness of the pixel Pb may be adjusted by control of the OLED according to the difference between the base voltage VSS and the voltage at the anode electrode.

A touch sensor TS may be connected to the touch driving device 140. The touch driving device 140 may transmit a TX signal STX to the touch sensor TS and receive a RX signal SRX from the touch sensor TS. The TX signal STX may include a touch driving signal and an uplink signal transmitted to an active pen, and the RX signal SRX may include a response signal in response to the touch driving signal and a downlink signal received from the active pen.

Parasitic capacitance Cp may be formed between the touch sensor TS and display electrodes, for example the data line DL, gate line GL, cathode electrode Cath, etc. The amount of parasitic capacitance Cp may vary according to the spacing distance from the touch sensor TS to each of the display electrodes, and the size of each of the display electrodes. In a normal OLED panel, the parasitic capacitance Cp between the touch sensor TS and the cathode electrode Cath may be the highest.

In an In-Cell type panel, the touch sensor TS and the cathode electrode Cath may be the same. In this case, the parasitic capacitance Cp between a cathode electrode Cath operated as the touch sensor TS and a nearby cathode electrode Cath may be formed the highest.

Display electrode noise formed at display electrodes, for example the data line DL, gate line GL, cathode electrode Cath, etc., may travel into the touch sensor TS through such parasitic capacitance Cp.

A display device according to an embodiment may minimize the effect of noise traveling into a touch sensor TS through such parasitic capacitance Cp. For example, the display device may receive signals from both a touch sensor and a display electrode and generate a touch signal by removing a signal, received from the display electrode, from a signal received from the touch sensor. Accordingly, a display noise signal traveling into the touch sensor may be removed from a signal received from the touch sensor, in whole or in part.

Figure 6:
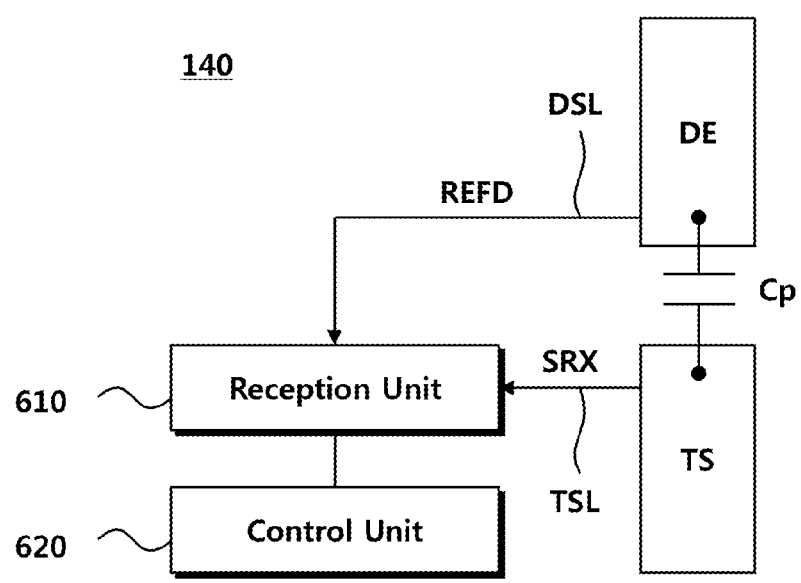
FIG. 6 is a schematic diagram of a touch driving device according to an embodiment.

FIG. 6 is a schematic diagram of the touch driving device 140 according to an embodiment.

Referring to FIG. 6, the touch driving device 140 may include a reception unit 610, a control unit 620, and the like.

The reception unit 610 may receive a RX signal SRX from a touch sensor TS. The RX signal SRX may be a response signal from the touch sensor TS in response to a touch driving signal and may be a downlink signal transmitted from an active pen to the touch sensor TS.

The reception unit 610 may be connected to the touch sensor TS through a touch signal line TSL. A plurality of touch sensors TS may be disposed on a panel. The touch sensors TS may be disposed to be electrically separated from one another, and the reception unit 610 may be connected to each of the touch sensors TS through a separate touch signal line TSL.

The reception unit 610 may receive a reference electrode signal REFD from a display electrode DE. To the display electrode DE, a constant voltage may be supplied. For example, when the display electrode DE is a common electrode, a common voltage at a constant voltage level may be supplied to the display electrode DE. The reference electrode signal REFD may have a voltage level similar to that of the constant voltage. However, the reference electrode signal REFD may have a waveform (voltage level)

fluctuating around the constant voltage described above, as a noise component is added to the reference electrode signal.

The reception unit 610 may be connected to the display electrode DE through the electrode signal line DSL.

When the display electrode DE is a common electrode or a cathode electrode, a single display electrode DE may be disposed on the panel. Only one display electrode DE may be disposed on the entire panel. Otherwise, two or more display electrodes DE may be disposed on the panel and disposed to be electrically connected to each other. In such an arrangement structure, the reception unit 610 may be connected to a display electrode DE through a single signal line DSL.

The reception unit 610 may generate a sensor signal by processing the RX signal SRX and may generate a noise signal by processing the reference electrode signal REFD. The reception unit 610 may generate a touch signal by removing the noise signal from the sensor signal.

The control unit 620 may generate touch data by processing the touch signal. The touch data may be transmitted to the outside or may be internally used to generate other information, for example touch coordinates. The touch signal is an analog signal, and the touch data may be digital data. The control unit 620 may generate the touch data by performing analog-to-digital conversion of the touch signal.

The reception unit 610 may include a plurality of channels. A touch signal may be generated in each of the channels during each time period.

Figure 7:
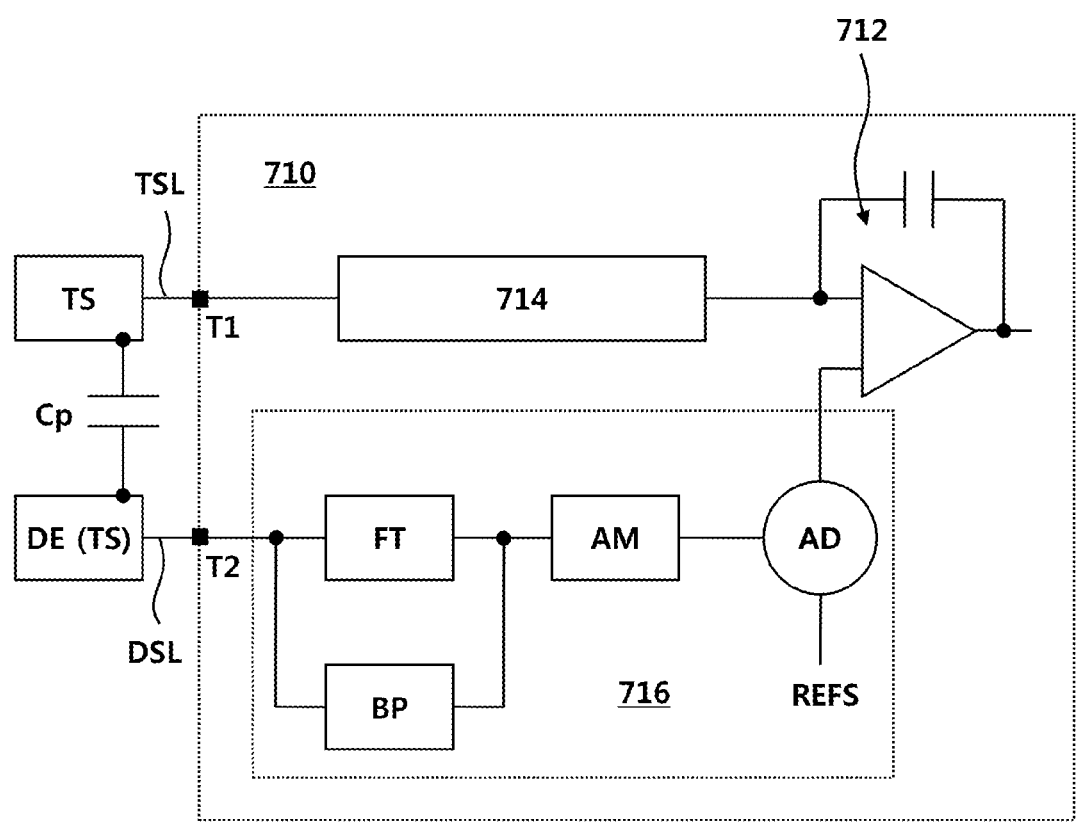
FIG. 7 is a schematic diagram of a channel of a touch driving device according to an embodiment.

FIG. 7 is a schematic diagram of a channel of a touch driving device according to an embodiment.

Referring to FIG. 7, two input terminals T1, T2 may be formed in a channel 710, a second input terminal T2 may be connected to a display electrode DE or a touch sensor TS through an electrode signal line DSL, and a first input terminal T1 may be connected to the touch sensor TS through a touch signal line TSL.

The channel 710 may include an integrator 712, a sensor signal processing circuit 714, and a noise signal processing circuit 716.

A sensor signal into which a RX signal received from the touch sensor TS is processed may be delivered to one terminal of the integrator 712, and a noise signal into which an electrode reference signal received from the display electrode DE is processed may be delivered to the other terminal of the integrator 712. An output terminal and the one terminal of the integrator 712 may be connected through a capacitor. In the capacitor, a signal obtained by the subtraction of a noise signal from the sensor signal may be integrated. A value obtained by integration in the capacitor may be output as a touch signal.

The sensor signal processing circuit 714 may be disposed between the one terminal of the integrator 712 and the touch signal line TSL. The sensor signal processing circuit 714 may adjust the level of a RX signal received from the touch sensor TS or may change the form of the RX signal. For example, the sensor signal processing circuit 714 may include a circuit for converting voltage into current, for example a circuit including a resistor, to convert a sensor signal of a voltage type into a sensor signal of a current type and deliver the converted sensor signal to the one terminal of the integrator 712.

The noise signal processing circuit 716 may be disposed between the other terminal of the integrator 712 and the electrode signal line DSL.

The noise signal processing circuit 716 may include a filter Fr, a bypass circuit BP, an amplifier AM, a signal combining unit AD, etc.

The filter FT may be a frequency filter. The filter FT may filter out a particular frequency component from the electrode reference signal received from the display electrode DE and may pass the other frequency components. For example, the filter FT may filter out low frequency components and pass high frequency components. Otherwise, the filter FT may pass frequencies within a range close to a display driving frequency and filter out frequencies within the other ranges.

The bypass circuit BP and the filter FT may be selectively connected to the electrode signal line DSL. When the bypass circuit BP is connected to the electrode signal line DSL, a signal received from the electrode signal line DSL may not pass through the filter FT.

The amplifier AM may adjust the level of a signal having passed through the filter FT or a signal having passed through the bypass circuit BP.

The level of noise contained in a signal received through the display electrode DE may be higher than the level of noise delivered from the display electrode DE to the touch sensor TS through parasitic capacitance Cp. The amplifier AM may adjust the level of the signal received through the display electrode DE such that the signal is similar in level with the noise delivered through the parasitic capacitance Cp.

A signal having passed through the amplifier AM may be combined with a reference voltage signal REFS by the signal combining unit AD. The sensor signal contains a base component, and the integrator 712 may remove the base component by subtracting the reference voltage signal REFS from the sensor signal. The integrator 712 may remove a noise component traveling into the touch sensor through the parasitic capacitance Cp by subtracting, from the sensor signal, a noise signal which is the signal having passed through the amplifier AM. The signal combining unit AD may combine the reference voltage signal REFS with the noise signal in order to deliver both the reference voltage signal REFS and the noise signal to the other terminal of the integrator 712. When the signal combining unit AD is implemented as a type of adder, the signal combining unit AD may combine the signals in a manner of adding the noise signal to the reference voltage signal REFS.

Figure 8:
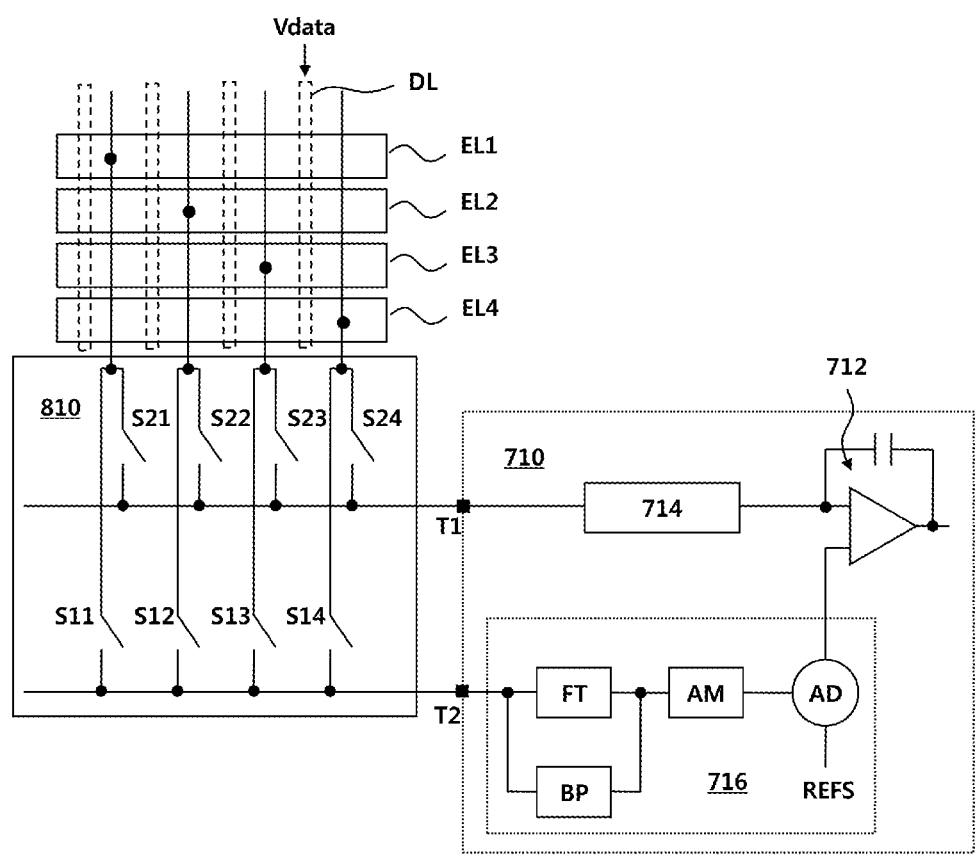
FIG. 8 is a diagram illustrating connection of a channel of a touch driving device to an electrode of a panel through a switch block according to an embodiment.

FIG. 8 is a diagram illustrating connection of a channel of the touch driving device to an electrode of a panel through a switch block, according to an embodiment.

Referring to FIG. 8, a channel 710 may be connected to electrodes EL1-EL4 through a switch block 810. The electrodes EL1-EL4 are disposed on a panel, and for convenience of description, the panel is not illustrated.

In the switch block 810, a plurality of switch elements S11-S14, S21-S24 may be disposed.

The plurality of switch elements S11-S14, S21-S24 may be classified into upper switch elements S21-S24 and lower switch elements S11-S14. One end of the upper switch elements S21-S24 may be connected to the electrodes EL1-EL4 respectively, and the other ends of the upper switch elements may be connected to a first input terminal T1 of the channel 710. One end of the lower switch elements S11-S14 may be connected to the electrodes EL1-EL4 respectively, and the other ends of the lower switch elements may be connected to a second input terminal T2 of the channel 710.

The electrodes EL1-EL4 are placed in the same layer, for example the common electrode layer (see reference number 220 in FIG. 2) or the cathode electrode layer (see reference number 430 in FIG. 4), and can also function as touch sensors or function as display electrodes. The in-cell type panel is one example using such placement. In the In-Cell type panel, a display electrode may be used as a touch sensor.

The electrodes EL1-EL4 may be selectively connected to the first input terminal T1 or the second input terminal T2 of the channel 710 through the switch elements S11-S14, S21-S24. For example, the electrodes EL1-EL4 are connected to pails of switch elements respectively, and when the upper switch elements S21-S24 among the pairs of switch elements establish connections and the lower switch elements S11-S14 are opened, the electrodes EL1-EL4 are connected to the first input terminal T1. In contrast, when the lower switch elements S11-S14 among the pairs of switch elements establish connections and the upper switch elements S21-S24 are opened, the electrodes EL1-EL4 are connected to the second input terminal T2.

The channel 710 may generate a sensor signal by receiving a signal from an electrode through the first input terminal T1 and generate a noise signal by receiving a signal from at least one of the other electrodes through the second input terminal T2. The one electrode connected to the first input terminal T1 may be an electrode functioning as a touch sensor, and the at least one of the other electrodes connected to the second input terminal T2 may be an electrode functioning as a display electrode. According to an embodiment, the one electrode connected to the first input terminal T1 is an electrode functioning as a touch sensor, and the at least one of the other electrodes connected to the second input terminal T2 is an electrode to which no function is assigned, for example, an electrode not functioning as a touch sensor or display electrode but connected to the ground or floated.

In a view from above the panel, the one electrode connected to the first input terminal T1 and the at least one of the other electrodes connected to the second input terminal T2 each may overlap the same data line DL. For example, a data line overlapped by the one electrode connected to the first input terminal T1 may be the same as a data line overlapped by the at least one of the other electrodes connected to the second input terminal T2. In another view, the one electrode connected to the first input terminal T1 and the at least one of the other electrodes connected to the second input terminal T2 may be coupled by the same data line and parasitic capacitance.

In yet another view, the one electrode connected to the first input terminal T1 and the at least one of the other electrodes connected to the second input terminal T2 may be disposed in parallel to the data line DL.

According to such arrangement, the one electrode connected to the first input terminal T1 and the at least one of the other electrodes connected to the second input terminal T2 may be affected by the same data voltage Vdata supplied to the data line DL and may be affected by the same noise caused by the same data voltage Vdata. Accordingly, the channel 710 may receive the same noise from the first input terminal T1 and the second input terminal T2 and then perform cancelling-out of the noise.

Turning on/off the switch elements S11-S14, S21-S24 may be controlled by the touch driving device, and turning on/off may be controlled by another device, for example, a data driving device, a timing controller, etc. The switch elements S11-S14, S21-S24 may be disposed in a non-display area of the panel where no pixel is disposed, in a plan view, and may be disposed in the touch driving device. According to an embodiment, the switch elements S11-S14, S21-S24 may be disposed in a separate printed circuit board.

Figure 9:
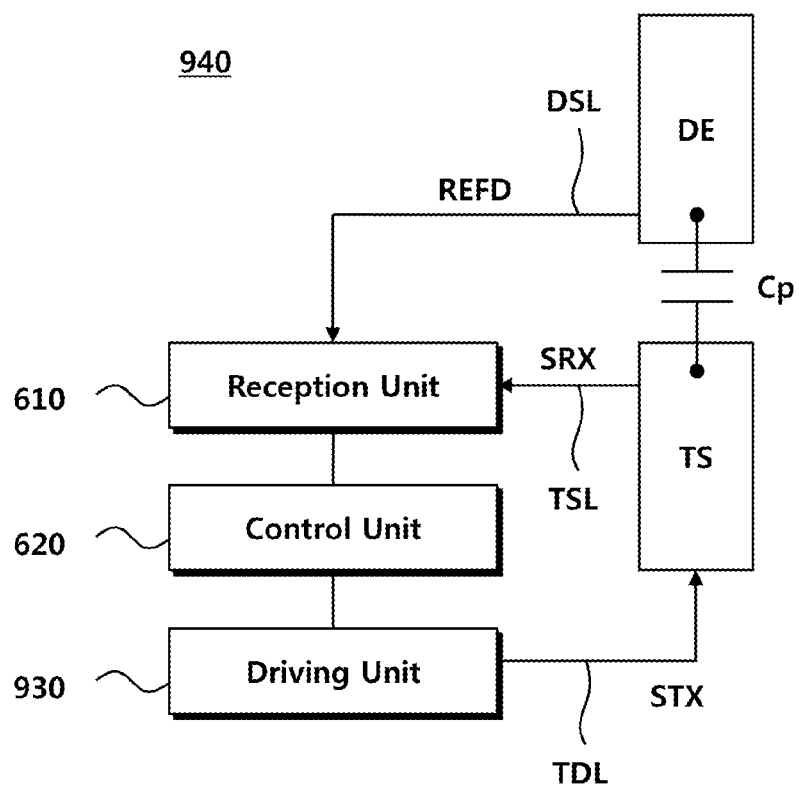
FIG. 9 is a diagram illustrating a touch driving device further including a driver unit according to an embodiment.

FIG. 9 is a diagram illustrating a touch driving device further including a driver unit, according to an embodiment.

Referring to FIG. 9, the touch driving device 940 may include a reception unit 610 and a control unit 620 and may further include a driving unit 930.

The driving unit 930, connected to a touch sensor TS by a touch driving line TDL, may transmit a TX signal STX to the touch sensor TS through the touch driving line TDL.

The TX signal STX may be a touch driving signal. When the driving unit 930 supplies a touch driving signal as the TX signal STX to the touch sensor TS, a reception unit 610 may receive, as a RX signal SRX, a response signal formed in the touch sensor TS in response to the touch driving signal.

The touch driving line TDL and a touch signal line TSL may be the same line. When touch sensors TS are operated in a self mode, a touch sensor TS to which a touch driving signal is supplied and a touch sensor TS from which a response signal is received may be the same. Then, the touch driving device 940 may transmit the touch driving signal and receive the response signal through the same line.

The touch driving device 940 may transmit or receive information to or from an active pen through a touch sensor TS.

The driving unit 930 may transmit an uplink signal to the active pen through the touch sensor TS, and the reception unit 610 may receive a downlink signal from the active pen through the touch sensor TS. Then, the uplink signal may be supplied to the touch sensor TS in the form of the TX signal STX, and the downlink signal may be received from the touch sensor TS in the form of the RX signal SRX.

When the uplink signal and the downlink signal are transmitted to or received from the touch sensor TS, a display driving voltage may be supplied to the display electrode. Then, a display noise signal formed in the display electrode may be a factor causing low sensitivity in reception of the downlink signal, and a touch driving device 940 according to an embodiment may minimize influence of the display noise signal over the downlink signal by removing a noise signal from a sensor signal.

Figure 10:
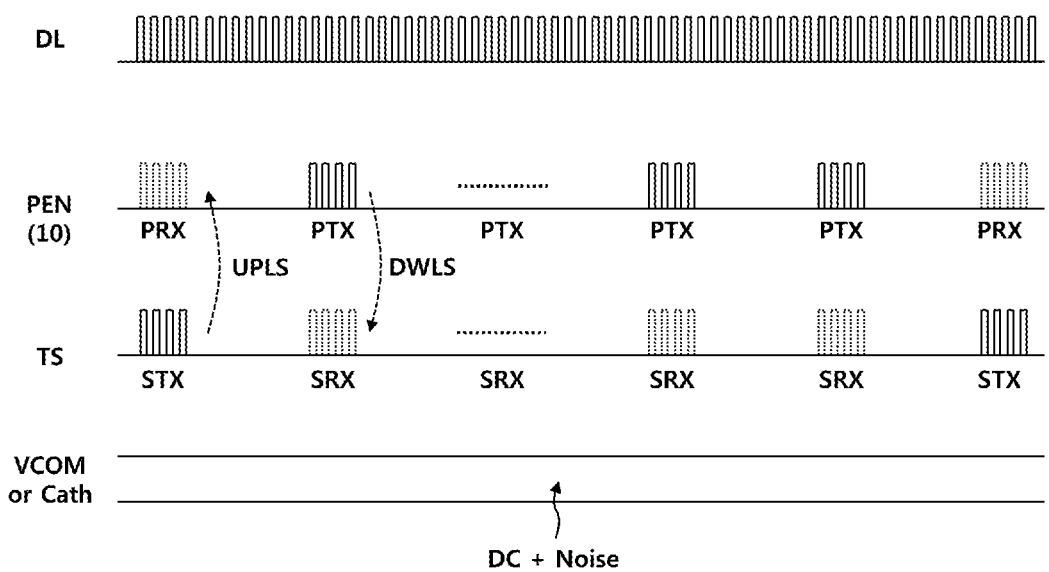
FIG. 10 is a diagram illustrating transmission/reception of a signal by a display device to/from an active pen according to an embodiment.

FIG. 10 is a diagram illustrating transmission/reception of a signal by a display device to/from an active pen, according to an embodiment.

Referring to FIG. 10, an uplink signal UPLS and a downlink signal DWLS may be transmitted/received between a touch driving device and an active pen 10. The uplink signal UPLS is transmitted/received in the manner in which the touch driving device supplies a TX signal STX to a touch sensor TS, and the active pen 10 recognizes a pen reception signal PRX delivered through the touch sensor TS. The downlink signal DWLS is transmitted/received in the manner in which the active pen 10 transmits a pen transmission signal PTX to the touch sensor TS, and the touch driving device receives an RX signal SRX from the touch sensor TS.

The uplink signal UPSL and the downlink signal DWLS may be transmitted/received during a period overlapping with a display-operating period, for example, a period during which a data voltage is supplied to a data line DL. Then, noise may be caused in response to a display operation at a common electrode VCOM or a cathode electrode Cath, which is one of display electrodes, and such noise may affect the touch sensor TS through parasitic capacitance.

When receiving a downlink signal, the touch driving device may sense a display electrode in addition to the touch sensor in order to remove noise due to such parasitic capacitance, and may generate a touch signal by removing a noise signal, generated from the display electrode, from a sensor signal generated by the touch sensor.

As hereinbefore described, such embodiment can increase the signal sensitivity of a touch sensor by removing or minimizing influence of noise traveling into the touch sensor.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A touch driving device comprising:
   a reception unit which is connected to a touch sensor through a touch signal line,
      generates a sensor signal by processing a signal received from the touch sensor, is connected directly through an electrode signal line to a display electrode capacitively coupled to the touch sensor, generates a noise signal by processing a signal received through the electrode signal line from the display electrode, and
      generates a touch signal by removing the noise signal from the sensor signal; and
   a control unit configured to generate touch data for sensing a touch by performing analog-to-digital conversion of the touch signal,
   wherein a display driving voltage is supplied to the display electrode.

2. The touch driving device of claim 1, wherein when the sensor signal is received, the display driving voltage is supplied to the display electrode.

3. The touch driving device of claim 1, further comprising:
   a driving unit configured to transmit an uplink signal to a touch pen through the touch sensor, wherein the reception unit receives a downlink signal delivered from the touch pen to the touch sensor and generates the touch signal.

4. The touch driving device of claim 1, further comprising
   a driving unit configured to supply a touch driving signal to the touch sensor, wherein the reception unit receives a response signal formed in the touch sensor in response to the touch driving signal and generates the touch signal.

5. The touch driving device of claim 1, wherein the reception unit processes a signal, received from the display electrode, by using at least one of a filter and an amplifier.

6. The touch driving device of claim 1, wherein the reception unit generates the touch signal by integrating a signal obtained by removing the noise signal and a reference voltage signal from the sensor signal.

7. The touch driving device of claim 1, wherein the touch sensor and the display electrode are disposed on a same layer and selectively connected to one input terminal or another input terminal of the reception unit through a switch element.

8. The touch driving device of claim 1, wherein the touch sensor and the display electrode are cathode electrodes of an organic light emitting diode (OLED) panel or common electrodes to which a common voltage is supplied in a liquid crystal display (LCD) panel.

9. The touch driving device of claim 1, wherein the reception unit receives a reference electrode signal corresponding to a voltage formed in the display electrode and processes the reference electrode signal to generate the noise signal.

10. The touch driving device of claim 1, wherein the reception unit comprises an integrator, comprising one terminal to which the sensor signal is delivered and another terminal to which the noise signal is delivered, and wherein the reception unit integrates a signal, obtained by removing the noise signal from the sensor signal, into a capacitor connected to the one terminal and an output terminal of the integrator to output the integrated signal.

* * * * *